US006223146B1

(12) United States Patent
Lyons et al.

(10) Patent No.: US 6,223,146 B1
(45) Date of Patent: Apr. 24, 2001

(54) METHOD AND APPARATUS FOR MANUFACTURING A PROGRAMMED ELECTRONIC CONTROL UNIT FOR USE IN AN ANTI-LOCK BRAKING (ABS) SYSTEM

(75) Inventors: Robert P. Lyons, Ann Arbor; Jeffrey E. Shaya, Farmington Hills; Mark C. Pinkowski, Livonia, all of MI (US)

(73) Assignee: Kelsey-Hayes Company, Livonia, MI (US)

(*) Notice: Subject to any disclaimer, the term of this patent is extended or adjusted under 35 U.S.C. 154(b) by 0 days.

(21) Appl. No.: 08/267,490

(22) Filed: Jun. 29, 1994

(51) Int. Cl.[7] .................................................. G06F 9/445
(52) U.S. Cl. ................................. 703/24; 703/26; 716/17
(58) Field of Search ..................... 364/431.04, 431.12, 364/426.02, 426.03, 488, 491; 703/24, 26; 716/4, 17

(56) References Cited

U.S. PATENT DOCUMENTS

| | | | |
|---|---|---|---|
| 3,821,714 | * 6/1974 | Hoff, Jr. et al. | 340/172.5 |
| 3,838,397 | * 9/1974 | Watson et al. | 340/172.5 |
| 3,906,207 | * 9/1975 | Rivere et al. | |
| 4,084,240 | * 4/1978 | Lappington | 364/431.04 |
| 4,366,541 | * 12/1982 | Mouri et al. | 364/431.12 |
| 4,638,144 | 1/1987 | Latta, Jr. | 219/121 |
| 4,772,984 | 9/1988 | Machdao | 361/301 |
| 4,833,620 | * 5/1989 | Takahashi | 364/490 |
| 4,850,785 | 7/1989 | Machado | 414/403 |
| 4,920,882 | * 5/1990 | Hoyt | 400/708 |
| 5,094,381 | 3/1992 | Amos et al. | 228/6.2 |
| 5,176,525 | 1/1993 | Nierescher et al. | 439/68 |
| 5,182,719 | * 1/1993 | Kuroda et al. | 364/490 |
| 5,212,881 | 5/1993 | Nishitsuka et al. | 29/740 |
| 5,273,349 | * 12/1993 | Kidston | 364/426.02 |

OTHER PUBLICATIONS

EMD Automotive, "OTP Programming Guidelines and Areas of Consideration", Rev. 7 Dated Jun. 24, 1993.

* cited by examiner

Primary Examiner—Kevin J. Teska
Assistant Examiner—Thai Phan
(74) Attorney, Agent, or Firm—MacMillan, Sobanski & Todd, LLC

(57) ABSTRACT

Method and apparatus are provided in a manufacturing area wherein a semiconductor having nonvolatile memory space is automatically programmed, tested, marked and mounted at a predetermined position on a circuit board to obtain a programmed electronic control unit (ECU). These functions are performed automatically based on programs downloaded from a common controller such as the appropriately programmed personal computer. A handler conveys the semiconductors loaded in micro tubes to a programming head of a memory programmer for programming and testing the semiconductors. Then the handler conveys the programmed semiconductors to a marker, such as a laser etcher, to mark a surface of the semiconductor with indicia related to a particular ABS system in which the semiconductor is to be used. Then the marked semiconductors are conveyed in a tube adapted to be loaded in an automatic mounting device such as a robot under the control of a robot controller. The robot automatically mounts the marked semiconductors at predetermined positions on circuit boards which are supported on a table which may comprise an X-Y table. Finally, each semiconductor mounted on its respective circuit board is tested by a programmable tester to ensure the proper functioning of the semiconductor on its circuit board.

30 Claims, 2 Drawing Sheets

METHOD AND APPARATUS FOR MANUFACTURING A PROGRAMMED ELECTRONIC CONTROL UNIT FOR USE IN AN ANTI-LOCK BRAKING (ABS) SYSTEM

TECHNICAL FIELD

This invention relates to a method and apparatus for manufacturing programmed electronic control units (ECUs) and, in particular, to methods and apparatus for manufacturing programmed ECUs for use in an anti-lock braking system (ABS).

BACKGROUND ART

Typically, ECUs for use on automotive vehicles such as for use in controlling anti-lock braking (ABS) systems are programmed by the semiconductor manufacturer. Then the programmed devices are shipped to the circuit board manufacturer and placed in electronic control units (ECUs).

One problem with this approach is the relatively long period of time from the time the semiconductors are programmed to the time they are placed on a circuit board by the circuit board manufacturer. This is a problem because this requires that the software for programming the semiconductors be finalized long before the semiconductors are to be manufactured by the circuit board manufacturer. Because of this, new algorithms cannot be introduced into the software at the last moment. Also, oftentimes the software cannot be completely debugged prior to programming the semiconductors. This may result in a large number of programmed semiconductors being scrapped.

At least one semiconductor manufacturer has sought to provide guidance by way of suggestions to the customers of such semiconductors so that the customers can create a programming center for programming such semiconductors. Such guidance and suggestions are contained in the document entitled "EMD Automotive—OTP Programming Guidelines And Areas Of Consideration", Revision 7, dated Jun. 24, 1993. However, this document provides little specific guidance in order to program semiconductor ECUs and provides no guidance at all as to how to reduce lead times during software changes and risk of software obsolescence.

SUMMARY OF THE INVENTION

An object of the present invention is to provide a method and system for manufacturing a programmed ECU for use in an anti-lock braking (ABS) system in a manufacturing area wherein a semiconductor of the programmed ECU is programmed a relatively short period of time before it is placed on a circuit board to reduce lead times during software changes and risk of software obsolescence.

Another object of the present invention is to provide a method and apparatus for manufacturing a programmed ECU for use in an anti-lock braking (ABS) system in a manufacturing area wherein semiconductors of the ECUs are programmed, tested, marked, and mounted on a circuit board and tested after mounting on the circuit board, all based on programs downloaded from a common computer such as a personal computer.

In carrying out the above objects and other objects of the present invention, a method is provided for manufacturing a programmed ECU for use in an anti-lock braking (ABS) system. The method includes the steps of providing a memory programmer having a programming head in the manufacturing area, programming the memory programmer with an ABS control program for the ABS system and at least one test program, and conveying a semiconductor having non-volatile memory space to the programming head. The programming head receives and retains the semiconductor. The method also includes the steps of utilizing the memory programmer to program at least a portion of the non-volatile memory space with the ABS control program, utilizing the memory programmer to test the programmed semiconductor with the at least one test program, providing a marker in the manufacturing area, programming the marker with a marking program, and conveying the programmed semiconductor to the marker. The programmed semiconductor is received and retained on the marker. Finally, the method includes the steps of utilizing the marker to mark a surface of the semiconductor with indicia related to the ABS system based on the marking program, providing a semiconductor mounting system in the manufacturing area, conveying the marked semiconductor to the mounting system, and utilizing the mounting system to automatically mount the marked semiconductor at a predetermined position on a circuit board to obtain the programmed ECU.

Still further in carrying out the above objects and other objects of the present invention, apparatus is provided for manufacturing programmed ECUs for use in anti-lock braking (ABS) systems in a manufacturing area. The apparatus includes a memory programmer having a programming head located in the manufacturing area, a marker located in the manufacturing area, and a handler in the manufacturing area for receiving at least one storage device having semiconductors stored therein. The handler also conveys semiconductors from the at least one storage device to the memory programmer and later conveys the programmed semiconductors from the memory programmer to the marker. Each of the semiconductors has a non-volatile memory space. The apparatus also includes a computer for programming the memory programmer with an ABS control program for the ABS system and with at least one test program and for programming the marker with a marking programmer. The programming head of the memory programmer receives and retains semiconductors from the handler so that the memory programmer can program at least a portion of each non-volatile memory space with the ABS control program and so that the memory programmer can test the programmed semiconductors with the at least one test program. After the programmed semiconductors are conveyed from the memory programmer to the marker by the handler, the programmed semiconductors are received and retained on the marker so that the marker can mark a surface of each of the semiconductors with indicia related to the ABS system based on the marking program. Finally, the apparatus further includes an automatic semiconductor mounting system in the manufacturing area for mounting the marked semiconductors at predetermined positions on circuit boards to obtain the programmed ECUs.

Preferably, the non-volatile memory space is ROM space and the at least one test program verifies the ROM space.

Also preferably, the marker is a laser marker and the marker marks the surface of the semiconductor with indicia based on the results of the test with the at least one test program.

The advantages accruing to the method and apparatus of the present invention as described below are numerous. For example, the semiconductors can be programmed at a circuit board manufacturer in a manufacturing area so that programming lead times are short, thereby minimizing the risk of software obsolescence.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 1:
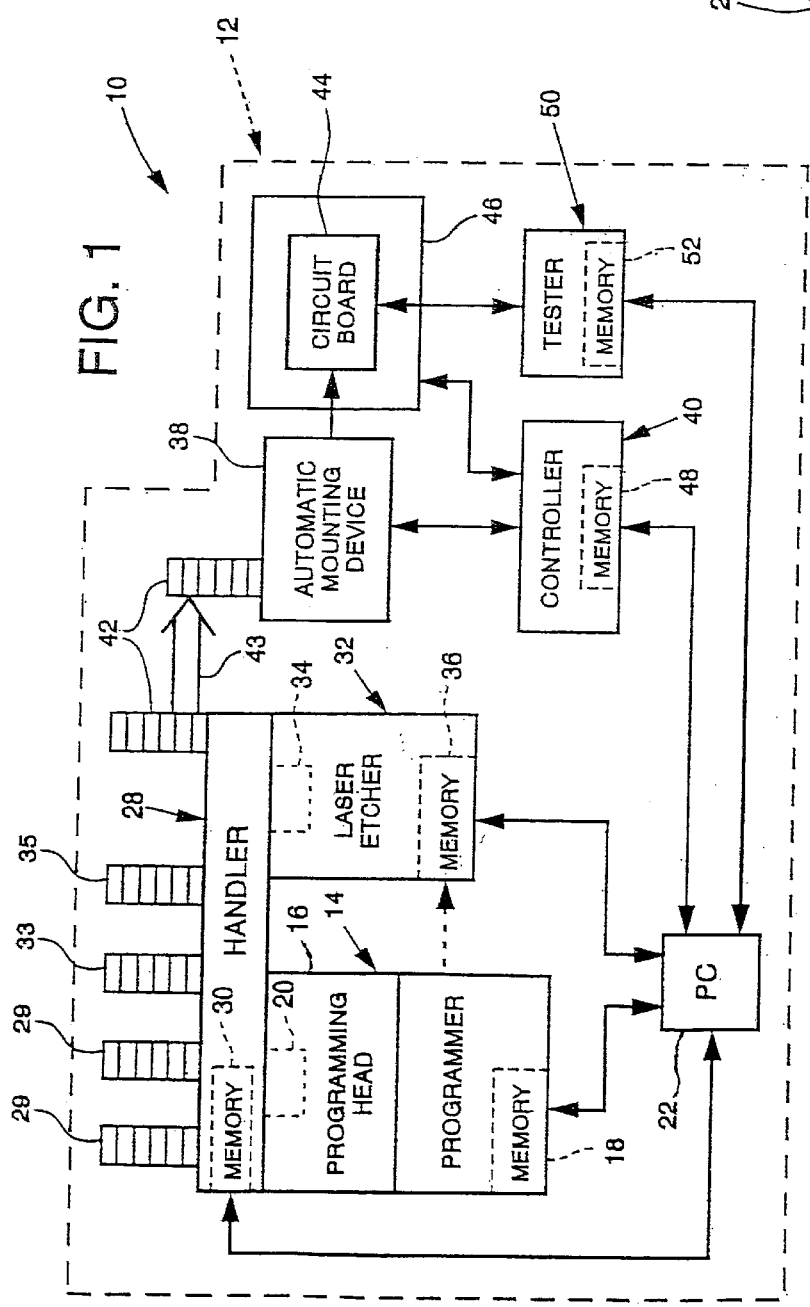
FIG. 1 is a block diagram schematic view illustrating the apparatus of the present invention in a manufacturing area.

Referring now to the drawing figures, there is illustrated in FIG. 1 an apparatus, generally indicated at 10, for manufacturing programmed ECUs for use in anti-lock braking (ABS) systems in a manufacturing area, generally indicated in phantom as 12.

The apparatus 10 includes a memory programmer, generally indicated at 14, which includes a programming head 16. Memory programmers such as the memory programmer 14 typically include a memory 18 as disclosed in U.S. Pat. Nos. 4,631,476, 5,276,839, and 5,176,525.

The memory programmer 14 receives a programmable semiconductor chip or device at a station 20 on the programming head 16. The semiconductor is removably coupled to the memory programmer 14 to receive voltage and current signals necessary for implanting or programming data into the semiconductor chip which may be a multi-chip module, generally indicated at 24 in FIG. 2. Presently available programming apparatus typically provide one or more sockets mounted on the programmer wherein each socket is constructed for receiving a semiconductor chip package of a particular construction and/or size.

Preferably, the semiconductor chip 24 is programmed with voltage and current signals to perform predetermined functions such as is required in an ABS system. Also preferably, the semiconductor chip 24 includes an erasable programmed read-only memory (EPROM). However, it is to be understood that the semiconductor chip 24 can also contain programmable read-only memory (PROM), gate arrays, etc. The memory programmer 14 is constructed to be coupled to a computer such as a personal computer 22 for interfacing a user with the memory programmer 14.

The memory programmer 14 includes a housing in which is mounted electronic circuitry necessary for providing the appropriate voltage and current signals to the semiconductor circuits to be programmed. Preferably, the personal computer 22 downloads ABS control and test software into the memory programmer 14 at the memory 18. The personal computer 22 preferably has the capacity to store a wide variety of ROM codes.

Also preferably, the memory programmer 14 includes a pin driver unit which is responsive to computer control for providing the voltage and current signals necessary for programming the semiconductor 24. The pin driver units also are provided for testing the semiconductor circuits of the semiconductor 24.

Figure 2:
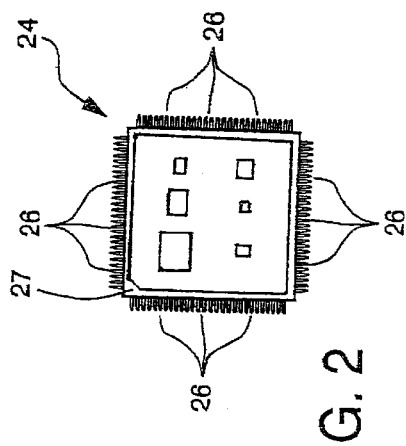
FIG. 2 is a top plan schematic view of a multi-chip module or semiconductor to be programmed by the apparatus and method of the present invention.

As illustrated in FIG. 2, the semiconductor device 24 includes a plurality of pins 26. Preferably, one of the pins is constructed for receiving a signal for supplying a source voltage to the semiconductor chip 24 and a set of other pins are constructed for receiving signals for addressing separate memory locations of the EPROM. A second set of pins may be constructed for receiving data to be stored in or read out of the EPROM. Finally, a third set of pins may be constructed for receiving signals associated with control and timing of the EPROM. Finally, one or more pins may be constructed for receiving a signal as a reference voltage for the EPROM. In this way, the memory programmer 14 is capable of programming its pin driver units for, in turn, programming the semiconductor chip 24.

As indicated in FIG. 2, the semiconductor chip 24 includes indicia 27 located at its upper left hand corner on its top surface to indicate a particular orientation of the semiconductor chip 24. This is necessary since the semiconductor chip 24 has substantially an equal number of pins on each side of the semiconductor chip 24, which sides are substantially equal in length.

The apparatus 10 also includes a handler, generally indicated at 28, which may comprise a pick and place handler but preferably comprises a gravity-fed handler located in the manufacturing area 12. Gravity-fed handlers are commercially available from Quality Automation, Inc. of Anaheim, Calif. and Exatron ATE of San Jose, Calif. Two handlers of Quality Automation, Inc. are disclosed in U.S. Pat. Nos. 4,772,984 and 4,850,785.

The handler 28 preferably includes a memory 30 adapted to be programmed by the PC 22. The handler 28 is also adapted to receive a number of storage devices in the form of semiconductor storage tubes 29 having unprogrammed semiconductors stored therein. The handler 28 is provided for conveying the semiconductors from their respective tubes 29 to the memory programmer 14 and for conveying the semiconductors after they are programmed from the memory programmer 14 to a marker, generally indicated at 32, which is also located in the manufacturing area 12.

As is well known in the art, the handler 28 feeds semiconductors from the positions they occupy in the storage tubes 29 into a chute which channels them to the station 20 within the programming head 16 in which they are programmed and tested. In this way, the handler 28 facilitates emptying the tubes 29 of the semiconductors.

Preferably, the handler 28 allows semiconductors to pass down an inclined track to be stopped and positioned at various defined stations therealong such as the EPROM programming station 20. Each semiconductor chip 24 may be tested at the EPROM programming station 20 or may be tested at another station along the handler 28. After programming at the programming station 20, the handler 28 releases the devices at a marking station 34 where the marker 32, which preferably comprises a laser etcher, marks the semiconductor devices 24 with appropriate indicia.

Also preferably, the handler 28 is programmed by the personal computer 22 so the handler 28 can properly sequence the flow of semiconductor devices for programming by the memory programmer 14 and for etching by the laser etcher 32.

The handler 28 may particularly comprise a Model 6000 handling system from the Exatron ATE Corporation. The Model 6000 programming system is relatively easily interfaced to the memory programmer 14 as well as to the marker 32. Furthermore, such a handler is easily adapted for connection to a controller such as the personal computer 22 so that the handler 28, the memory programmer 14, and the laser etcher 32 can be operated simultaneously and synchronously.

The handler 28 also preferably includes input tube holders (not shown) for holding the input tubes 29 and output tube holders (not shown) for holding eject tubes such as a fail eject tube 33 and a pass eject tube 35 which. has contained therein programmed and marked semiconductor chips.

Laser etchers such as the laser etcher 32 for laser etching semiconductor chips are well known in the art. For example, U.S. Pat. No. 4,638,144 discloses one type of laser etcher. The laser etcher 32 typically is capable of receiving programmed semiconductors at the station 30, marking the semiconductors and thereafter allowing the handler 28 to place the marked semiconductors in either the pass tube 35 or the fail tube 33. The laser etcher 32 also includes a memory 36 so that the laser etcher 32 can be programmed by the PC 22. Commercial laser marker systems are available from Automated Industrial Systems of Erie, Pa.

The apparatus 10 further includes an automatic mounting system in the form of an automatic mounting device 38 and a controller, generally indicated at 40. Preferably, the automatic mounting device comprises a robot and the controller 40 is a robot controller. The robot 38 includes a tube holder for holding a plastic tube 42 of programmed and marked semiconductors. The plastic tube 42 of semiconductors is conveyed from the handler 28 to the robot 38, as indicated by arrow 43.

The robot 38 mounts the programmed and marked semiconductors at predetermined positions on a circuit board 44 to obtain a programmed ECU. The circuit board 44 may be supported on a table such as an X,Y table 46 also controlled by the controller 40. Alternatively, the circuit board 44 may be supported on a stationary table wherein the robot 38 moves both in an X direction and a Y direction under control of the controller 40.

Mounting systems including robots controlled by robot controllers are generally illustrated in U.S. Pat. Nos. 5,094,381 and 5,212,881. In general, such mounting systems provide a storage section for storing such semiconductor devices and a mounting head for picking up a selected semiconductor device from the storage section, carrying it to a designated location above the circuit board 44 and thereafter mounting the semiconductor device on the circuit board 44.

The personal computer 22 programs the controller 40 by downloading data to the controller 40 for storage in a memory 48 therein so that the controller 40 knows what kind of semiconductor device is to be mounted on the circuit board 44 and at what location on the circuit board 44 the semiconductor device is to be inserted.

The apparatus 10 also includes a tester, generally indicated at 50, which is also programmable by the personal computer 22 by receiving data at a memory 52 thereof from the personal computer 22 so that the tester 50 knows what test to perform on the assembled ECU after mounting of the semiconductor device 24 on the circuit board 44. One such tests performed by the tester 50 is to verify correct ROM check-sum in an ALDL stream of the ECU.

The automatic mounting system may also include an inspection camera (not shown) to visually inspect the semiconductor device 24 and its conductive leads 26 within the manufacturing area 12 to ensure that the semiconductor chip 24 is in proper orientation and that all conductive leads 26 are present and undamaged. Such an inspection camera can also be utilized or a separate camera can be utilized in conjunction with the robot 38 to place the semiconductor chip 24 at a desired location on the circuit board 44.

Also alternatively, the robot 38 may include a tool changer (not shown) so that an end effector of the robot 38 such as a gripper may be rapidly and efficiently interchanged with another end effector to permit different electronic components to be automatically mounted on the circuit board 44 during an assembly operation.

Figure 3:
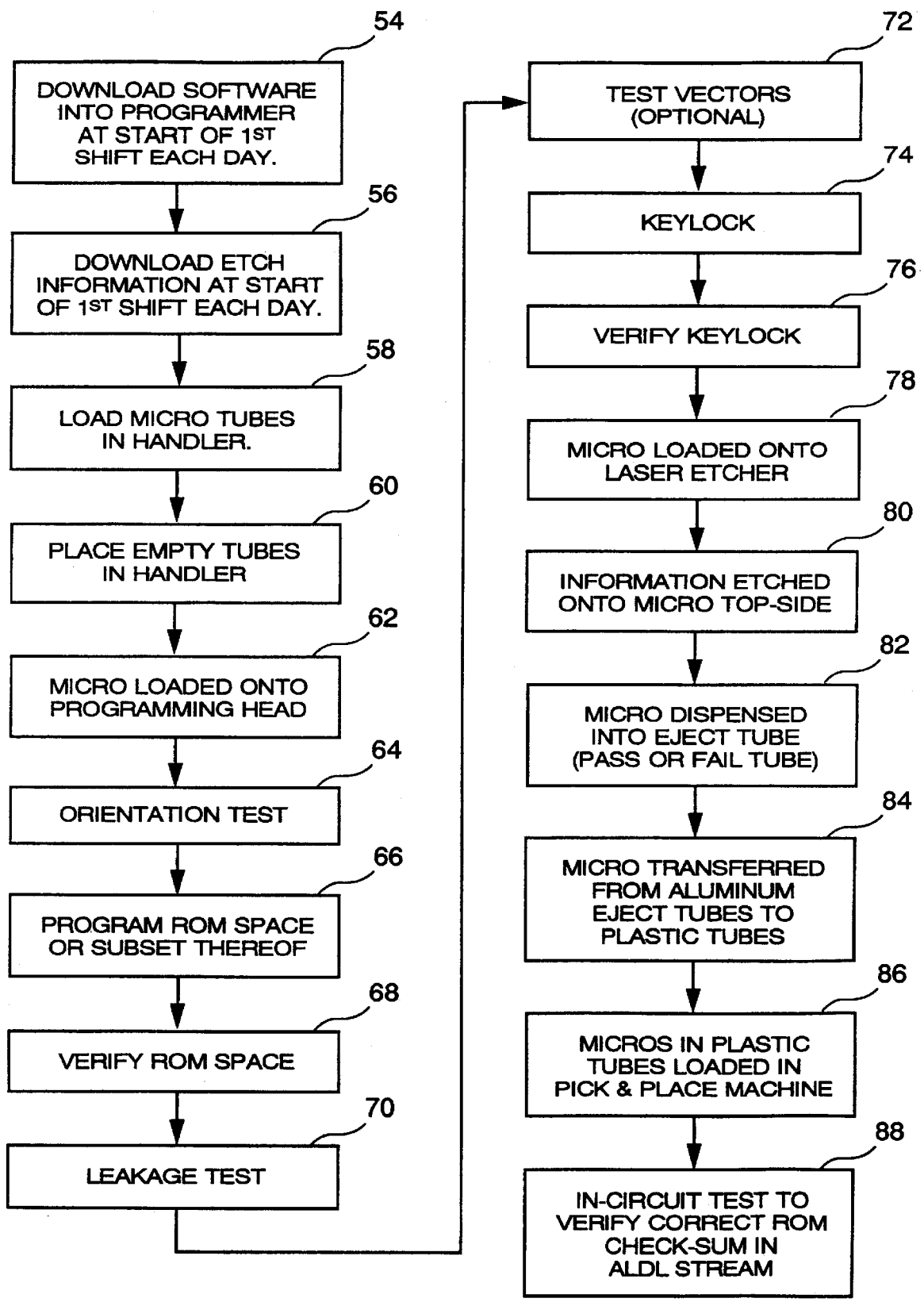
FIG. 3 is a block diagram flow chart illustrating many of the steps of the method of the present invention.

Referring now to FIG. 3, there is illustrated, in flow chart form, various processing steps for manufacturing a programmed ECU for use in an anti-lock braking (ABS) system in the manufacturing area 12.

At block 54, software is downloaded from the personal computer 22 into the memory 18 of the memory programmer 14, typically at the start of the first shift of each day. This software typically includes an ABS control program for a particular ABS system and test programs such as a first test program for verifying ROM space on the semiconductor chip 24.

The software downloaded into the memory 18 also typically includes a program to keylock the ROM space and to verify the keylock.

The test programs also include a third test program which is utilized to sense the orientation of the semiconductor chip 24 on the programming head 16 prior to programming the memory space with the ABS control program.

Finally, the downloaded software includes a fourth test program which is utilized by the memory programmer 14 to test leakage current of the semiconductor chip 24.

At block 56 of FIG. 3, the personal computer 22 also downloads information or data into the memory 36 of the laser etcher 26, also preferably, at the start of the first shift of each day. The data downloaded into the memory 36 is utilized to mark the surface of the semiconductor chip 24 with indicia related to the ABS control program programmed into the semiconductor chip 24.

Furthermore, either the memory programmer 14 or the personal computer 22 may communicate information or data to the laser etcher 32 which indicates how successfully the memory programmer 14 has programmed a particular semiconductor chip or whether any of the tests performed by the memory programmer 14 have been successful. With this information, the laser etcher 32 may also etch indicia on a particular semiconductor chip which indicates whether the semiconductor chip passed one or more of the tests performed by the memory programmer 14.

At block 58, tubes of unprogrammed semiconductor chips are loaded on the handler 28. This may be done either manually or automatically.

At block 60, empty tubes are placed in the handler 28, also either manually or automatically, for receiving pass or fail semiconductor chips.

At block 62, the semiconductor chips are sequentially loaded onto the programming head 16 for programming.

At block 64, an orientation test is performed on a semiconductor chip at the programming head 16 to ensure that the semiconductor chip is in its proper orientation within the programming head 16 so that the proper current and voltage signals for programming the semiconductor chip 24 are applied to the proper pins 26 of the semiconductor chip 24.

At block 66, the entire ROM space or a subset thereof is programmed by the memory programmer 14.

At block 68, after programming, the ROM space is verified by the memory programmer 14.

At block 70, the current leakage test is performed by the memory programmer 14.

At block 72, an optional test may be performed testing the vectors within the semiconductor chip 24.

At block 74, the keylock test is performed and at block 76, the memory programmer 14 verifies the keylock.

After the semiconductor chips have been programmed and tested, the handler 28 conveys the programmed semiconductor chips from the station 20 on the programming head 16 to the station 34 on the laser etcher 32, as indicated at block 78.

At block 80, the laser etcher 32 etches information on the top surface of the semiconductor chip 24 to indicate the particular anti-lock braking system in which the semiconductor chip is to be used and/or to indicate the results of one or more of the tests performed by the memory programmer 14 when the semiconductor chip 24 was at the station 20 on the programming head 16.

At block 82, the semiconductor chips are dispensed into either the pass tube 35 or the fail tube 33 mounted on the handler 28. Preferably, such pass and fail tubes 35 and 33, respectively, are made of a metal such as aluminum.

At block 84, the semiconductor chips preferably are transferred from the pass tubes 35 into the plastic tube 42 which is adapted to be picked up and held by the robot 38.

The steps represented by blocks 84 and 86 may be performed either manually or automatically.

Finally, at block 88, after the robot 38 has mounted a semiconductor chip on the circuit board 44, the tester 50 performs an in-circuit test to verify that the ABS control program was properly programmed in the memory space. For example, the tester 50 verifies correct ROM check-sum in an ALDL stream, thereby ensuring that the semiconductor chip properly performs with the rest of the circuit elements on the circuit board 50.

The advantages accruing to the method and apparatus of the present invention are numerous. For example, the steps of programming, etching, mounting, and testing a semiconductor chip can all be performed in a single manufacturing area such as the manufacturing area 12 under the control of programs downloaded from a single computer such as the personal computer 22. In this way, the semiconductor chips 24 can be programmed a very short period of time before they are placed on circuit assemblies, thereby reducing lead time during times of software changes and thereby minimizing the risk of software obsolescence.

While the best mode for carrying out the invention has been described in detail, those familiar with the art to which this invention relates will recognize various alternative designs and embodiments for practicing the invention as defined by the following claims.

What is claimed is:

1. A method for manufacturing a programmed ECU for use in an anti-lock braking (ABS) system in a manufacturing area, the method comprising the steps of:

providing a memory programmer having a programming head in the manufacturing area;

programming the memory programmer with an ABS control program for the ABS system and at least one test program;

conveying a semiconductor having non-volatile memory space to the programming head, the programming head receiving and retaining the semiconductor;

utilizing the memory programmer to program at least a portion of the non-volatile memory space with the ABS control program;

utilizing the memory programmer to test the programmed semiconductor with the at least one test program;

providing a marker in the manufacturing area;

programming the marker with a marking program;

conveying the programmed semiconductor to the marker;

receiving and retaining the programmed semiconductor on the marker;

utilizing the marker to mark a surface of the semiconductor with indicia related to the ABS system based on the marking program;

providing a semiconductor mounting system in the manufacturing area;

conveying the marked semiconductor to the mounting system; and utilizing the mounting system to automatically mount the marked semiconductor at a predetermined position on a circuit board to obtain the programmed ECU.

2. The method as claimed in claim 1 wherein the non-volatile memory space is ROM space and wherein the at least one test program verifies the ROM space.

3. The method as claimed in claim 2 wherein the memory programmer is programmed with a second test program and the method further comprises the steps of utilizing the memory programmer to keylock the ROM space and utilizing the memory programmer to verify the keylock with the second test program.

4. The method as claimed in claim 3 wherein the memory programmer is programmed with a third test program and the semiconductor is retained in a certain orientation on the programming head and wherein the method further comprises the step of utilizing the memory programmer to sense the orientation of the semiconductor on the programming head with the third test program prior to programming the memory space with the ABS control program.

5. The method as claimed in claim 4 wherein the memory programmer is programmed with a fourth test program and wherein the method further comprises the step of utilizing the memory programmer to test leakage current of the semiconductor with the fourth test program.

6. The method as claimed in claim 2 further comprising the steps of providing a tester in the manufacturing area and utilizing the tester to verify that the ABS control program was properly programmed in the memory space.

7. The method as claimed in claim 1 wherein the marker is a laser marker.

8. The method as claimed in claim 1 further comprising the step of utilizing the marker to mark the surface of the semiconductor with indicia based on the results of the test with the at least one test program.

9. The method as claimed in claim 1 further comprising the step of storing a tested semiconductor in either a first or second storage area within the manufacturing area based on the results of the test with the at least one test program.

10. The method as claimed in claim 9 wherein the step of conveying the marked semiconductor includes the step of transferring the marked semiconductor stored in either the first or second storage area to a third storage area within the manufacturing area and thereafter moving the marked semiconductor from the third storage area to the semiconductor mounting system.

11. The method as claimed in claim 10 wherein the step of moving is accomplished by the semiconductor mounting system.

12. The method as claimed in claim 1 wherein the semiconductor includes at least one microprocessor.

13. The method as claimed in claim 1 wherein the semiconductor mounting system includes a robot controlled by a robot controller.

14. The method as claimed in claim 11 wherein the step of conveying the marked semiconductor is performed by the robot.

15. Apparatus for manufacturing programmed ECUs for use in anti-lock braking (ABS) systems in a manufacturing area, the apparatus comprising:

a memory programmer having a programming head located in the manufacturing area;

a marker located in the manufacturing area;

a handler in the manufacturing area for receiving at least one storage device having semiconductors stored therein, for conveying semiconductors from the at least one storage device to the memory programmer and for conveying programmed semiconductors from the memory programmer to the marker, each of the semiconductors having a non-volatile memory space;

a computer for programming the memory programmer with an ABS control program for the ABS system and with at least one test program and for programming the marker with a marking program, the programming head of the memory programmer receiving and retaining semiconductors from the handler so that the memory programmer can program at least a portion of each non-volatile memory space with the ABS control program and so that the memory programmer can test the programmed semiconductors with the at least one test program, and wherein after the programmed semiconductors are conveyed from the memory programmer to the marker by the handler, the programmed semiconductors are received and retained on the marker so that the marker can mark a surface of each of the semiconductors with indicia related to the ABS system based on the marking program; and an automatic semiconductor mounting system in the manufacturing area for mounting the marked semiconductors at predetermined positions on circuit boards to obtain the programmed ECUs.

16. The apparatus as claimed in claim 15 wherein the non-volatile memory space is ROM space and wherein the at least one test program verifies the ROM space.

17. The apparatus as claimed in claim 16 wherein the memory programmer is programmed with a second test program by the computer to keylock the ROM space and verify the keylock.

18. The apparatus as claimed in claim 17 wherein each of the semiconductors is retained in a certain orientation on the programming head and the memory programmer is programmed with a third test program by the computer to sense the orientation of each of the semiconductors on the programming head prior to programming the memory space with the ABS control program.

19. The apparatus as claimed in claim 18 wherein the memory programmer is programmed with a fourth test program by the computer to test leakage current of each of the semiconductors.

20. The apparatus as claimed in claim 16 further comprising a tester in the manufacturing area for verifying that the ABS control program was properly programmed in the memory space.

21. The apparatus as claimed in claim 20 wherein the tester is programmable and wherein the computer programs the tester to verify that the ABS control program was properly programmed in the memory space.

22. The apparatus as claimed in claim 15 wherein the marker is a laser marker.

23. The apparatus as claimed in claim 15 wherein the marker marks the surface of each of the semiconductors with indicia based on the results of the test with the at least one test program.

24. The apparatus as claimed in claim 15 further comprising second and third storage devices received by the handler wherein the handler stores tested semiconductors in either the second or third storage device based on the results of the test with the at least one test program.

25. The apparatus as claimed in claim 24 further comprising a fourth storage device for receiving and storing semiconductors from either the second or third storage device wherein the fourth storage device is adapted for connection to the automatic mounting system.

26. The apparatus as claimed in claim 25 wherein the mounting system includes a mounting device controlled by a controller programmable by the computer so that the mounting device automatically removes the marked semiconductors from the fourth storage device and automatically mounts the marked semiconductors at the predetermined positions on the circuit boards.

27. The apparatus as claimed in claim 15 wherein each semiconductor includes at least one microprocessor.

28. The apparatus as claimed in claim 15 wherein the automatic mounting system includes a robot controlled by a robot controller.

29. The apparatus as claimed in claim 28 wherein the robot controller is programmable and wherein the computer programs the robot controller so that the robot picks up and mounts the marked semiconductors at the predetermined positions on the circuit boards.

30. The apparatus as claimed in claim 15 wherein each of the semiconductors includes at least one microprocessor and an EPROM for storing the ABS control program.

* * * * *